(12) United States Patent
Fujii et al.

(10) Patent No.: US 11,262,485 B2
(45) Date of Patent: Mar. 1, 2022

(54) IMAGE SENSOR AND ELECTRONIC APPARATUS

(71) Applicant: SONY SEMICONDUCTOR SOLUTIONS CORPORATION, Kanagawa (JP)

(72) Inventors: Nobutoshi Fujii, Kanagawa (JP); Hiroyuki Itou, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/736,371

(22) PCT Filed: Jun. 24, 2016

(86) PCT No.: PCT/JP2016/003048
§ 371 (c)(1),
(2) Date: Dec. 14, 2017

(87) PCT Pub. No.: WO2017/006534
PCT Pub. Date: Jan. 12, 2017

(65) Prior Publication Data
US 2018/0188422 A1 Jul. 5, 2018

(30) Foreign Application Priority Data
Jul. 8, 2015 (JP) .............. JP2015-136840

(51) Int. Cl.
*G02B 3/00* (2006.01)
*H01L 27/146* (2006.01)
(Continued)

(52) U.S. Cl.
CPC ......... *G02B 3/0068* (2013.01); *G02B 3/0075* (2013.01); *H01L 27/14623* (2013.01);
(Continued)

(58) Field of Classification Search
CPC .... G02B 3/0068; G02B 3/0075; G02B 1/005; G02B 5/23; H01L 27/14623;
(Continued)

(56) References Cited

U.S. PATENT DOCUMENTS 5,163,117 A * 11/1992 Imanishi .............. G02B 3/0012
355/1
2002/0130326 A1* 9/2002 Tamura ................... F21K 9/00
257/79

(Continued)

FOREIGN PATENT DOCUMENTS

| JP | H03-175402 | 7/1991 |
| JP | H07-172868 | 7/1995 |

(Continued)

OTHER PUBLICATIONS

Light Field Photography with a Hand-held Plenoptic Camera, Ng et al., Stanford Tech Report (Year: 2005).*

(Continued)

*Primary Examiner* — Travis S Fissel
(74) *Attorney, Agent, or Firm* — Sheridan Ross P.C.

(57) ABSTRACT

There is provided imaging devices and methods of forming the same, the imaging devices, including: a photodetector layer; and a light-blocking member stacked above the photodetector layer, where the light-blocking member includes at least one light-transmitting portion and at least one lens portion.

19 Claims, 9 Drawing Sheets

(51) Int. Cl.
*H01L 31/0232* (2014.01)
*H04N 5/225* (2006.01)

(52) U.S. Cl.
CPC .. *H01L 27/14627* (2013.01); *H01L 27/14629* (2013.01); *H01L 27/14685* (2013.01); *H01L 31/02327* (2013.01); *H04N 5/2254* (2013.01); *H01L 27/14618* (2013.01)

(58) Field of Classification Search
CPC ........... H01L 27/1462; H01L 27/14601; H01L 27/14627; H01L 27/14629; H01L 27/14683; H01L 27/14685
USPC .................................................. 359/664, 722
See application file for complete search history.

(56) References Cited

U.S. PATENT DOCUMENTS

| | | | | |
|---|---|---|---|---|
| 2002/0159738 A1* | 10/2002 | Aoki | ...................... | G02F 1/2255 385/129 |
| 2005/0190683 A1* | 9/2005 | Ando | ...................... | G02B 5/04 369/121 |
| 2007/0019101 A1* | 1/2007 | Minamio | .......... | H01L 27/14618 348/335 |
| 2007/0081758 A1* | 4/2007 | Tono | .................. | G01N 21/7703 385/12 |
| 2008/0121784 A1 | 5/2008 | Chang et al. | | |
| 2010/0052192 A1 | 3/2010 | Hasegawa et al. | | |
| 2010/0091387 A1* | 4/2010 | Hirao | .................. | G02B 13/006 359/793 |
| 2011/0157585 A1* | 6/2011 | Shibayama | ............... | G01J 3/02 356/300 |
| 2012/0081801 A1 | 4/2012 | Duparre et al. | | |
| 2013/0050526 A1* | 2/2013 | Keelan | ................. | H04N 5/2254 348/231.99 |
| 2013/0169920 A1* | 7/2013 | Wada | .................... | C03B 23/037 349/200 |
| 2014/0061481 A1* | 3/2014 | Kondo | .................... | G01T 1/202 250/361 R |
| 2014/0070080 A1* | 3/2014 | Ruh | ...................... | G01S 7/4813 250/216 |
| 2014/0293428 A1 | 10/2014 | Yasuda et al. | | |
| 2014/0347747 A1 | 11/2014 | Rudmann et al. | | |
| 2016/0133762 A1* | 5/2016 | Blasco Claret | ... | H01L 31/02327 257/432 |

FOREIGN PATENT DOCUMENTS

| | | | |
|---|---|---|---|
| JP | 2004-128201 | 4/2004 | |
| JP | 2005-072662 | 3/2005 | |
| JP | 2005-352345 | 12/2005 | |
| JP | 2006 208359 | 8/2006 | |
| JP | 2009-238205 | 10/2009 | |
| JP | 2010-056170 | 3/2010 | |
| JP | 2012-529069 | 11/2012 | |
| JP | 2014-022573 | 2/2014 | |
| JP | 201422573 A * | 2/2014 | ............ H01L 27/14 |
| JP | 2014-521992 | 8/2014 | |
| JP | 2014-190988 | 10/2014 | |

OTHER PUBLICATIONS

International Search Report and Written Opinion prepared by the European Patent Office dated Aug. 25, 2016, for International Application No. PCT/JP2016/003048.
Official Action (no English translation available) for Japanese Patent Application No. 2015-136840, dated Jul. 18, 2019, 7 pages.
Official Action (no English translation available) for Japanese Patent Application No. 2015-136840, dated Feb. 18, 2020, 4 pages.

* cited by examiner

[Fig. 1]
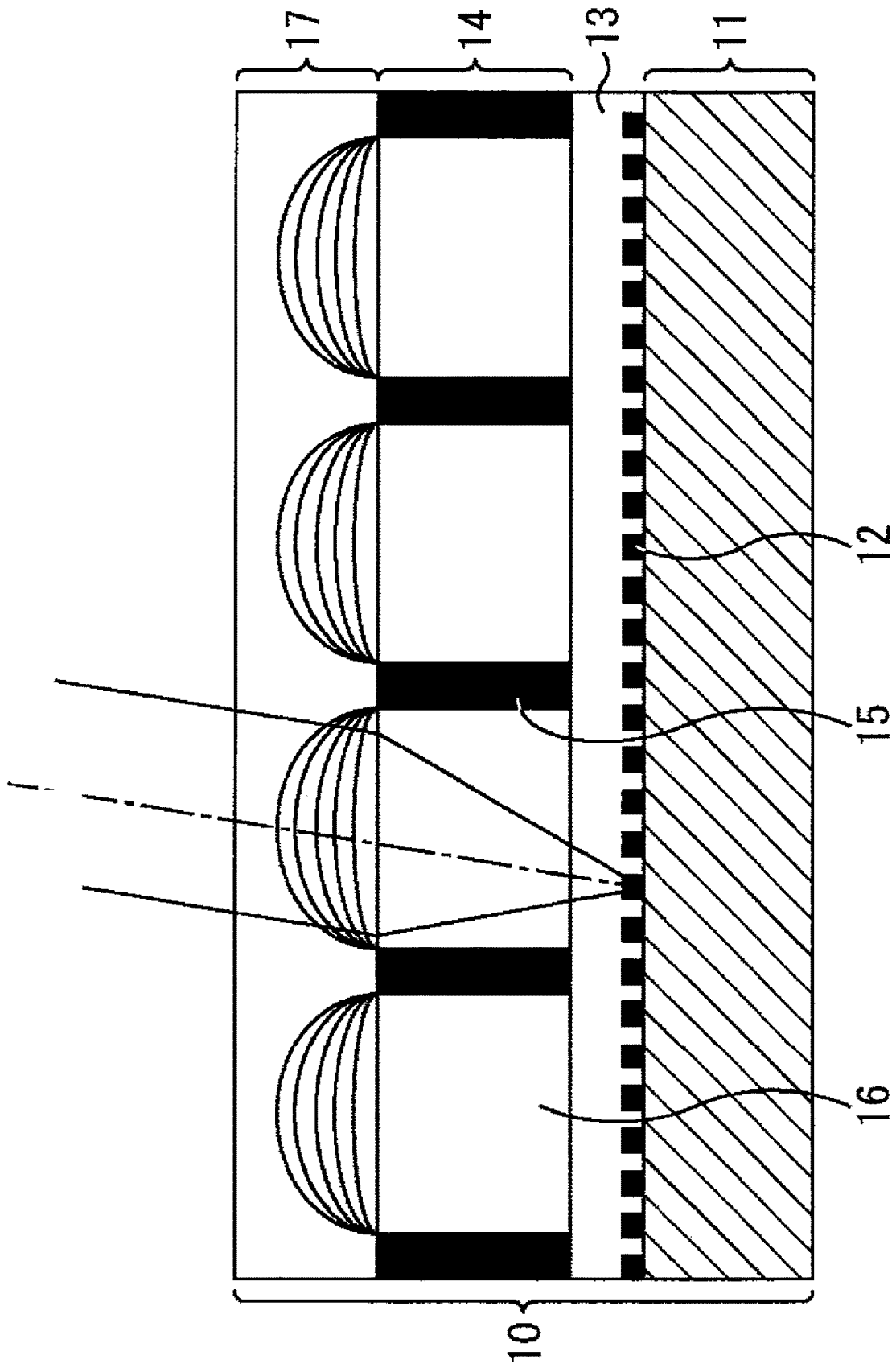

[Fig. 2]
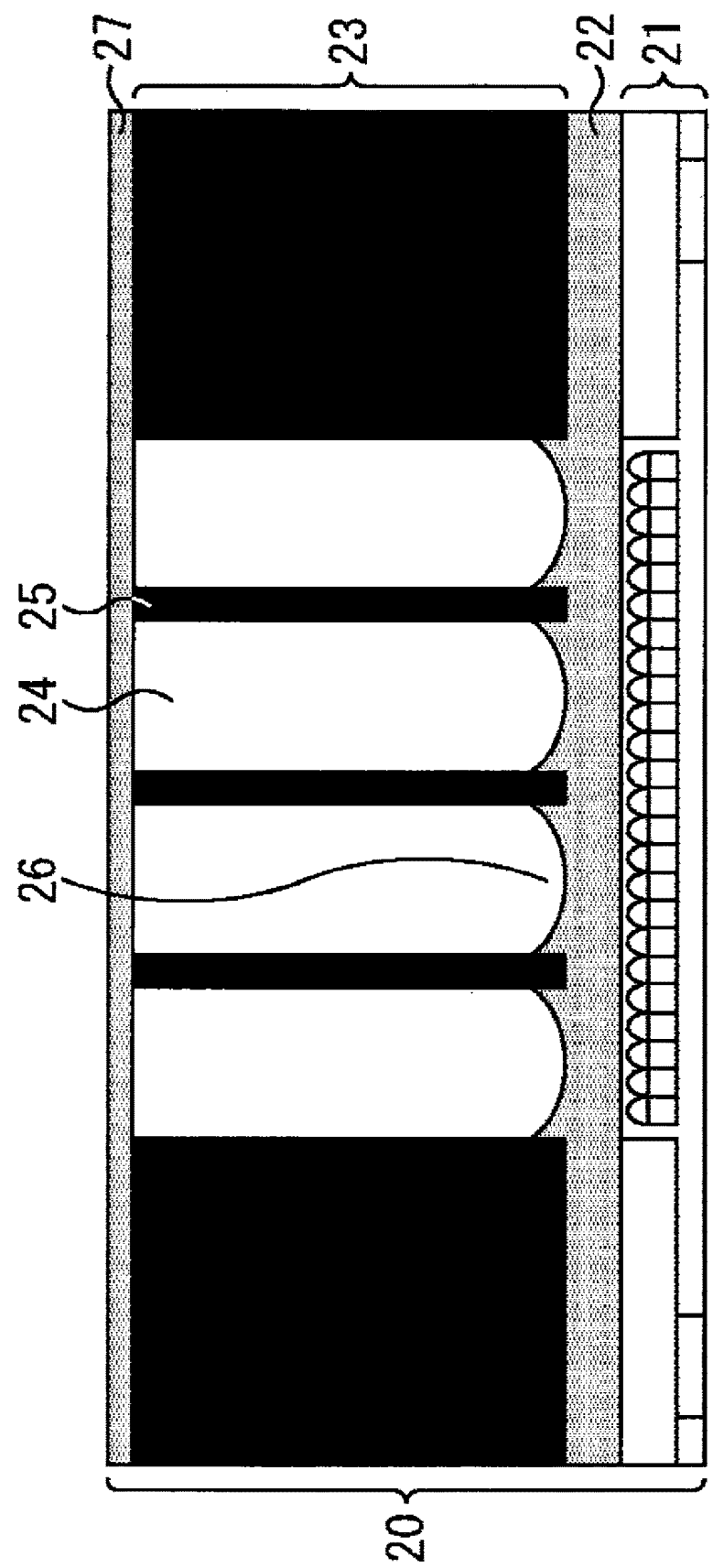

[Fig. 3]
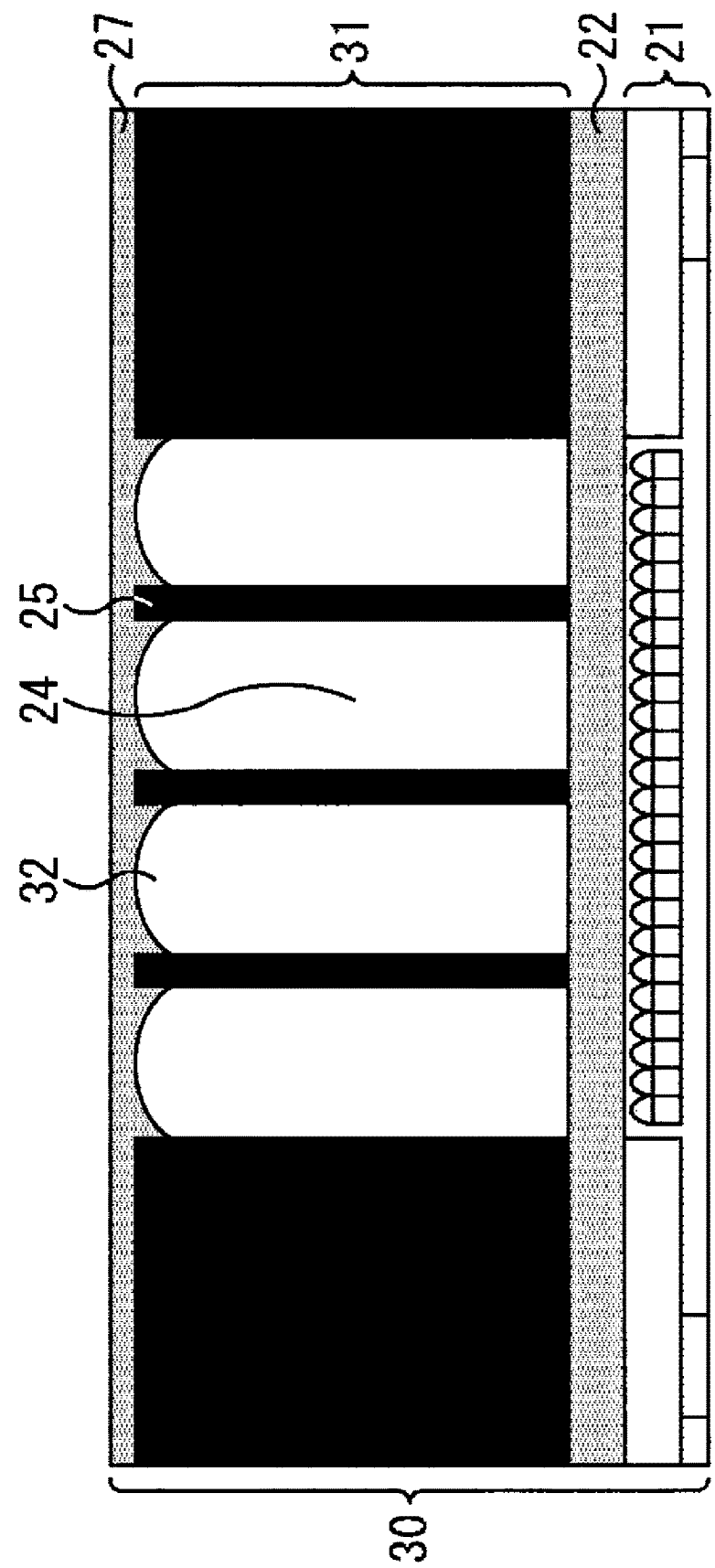

[Fig. 4]
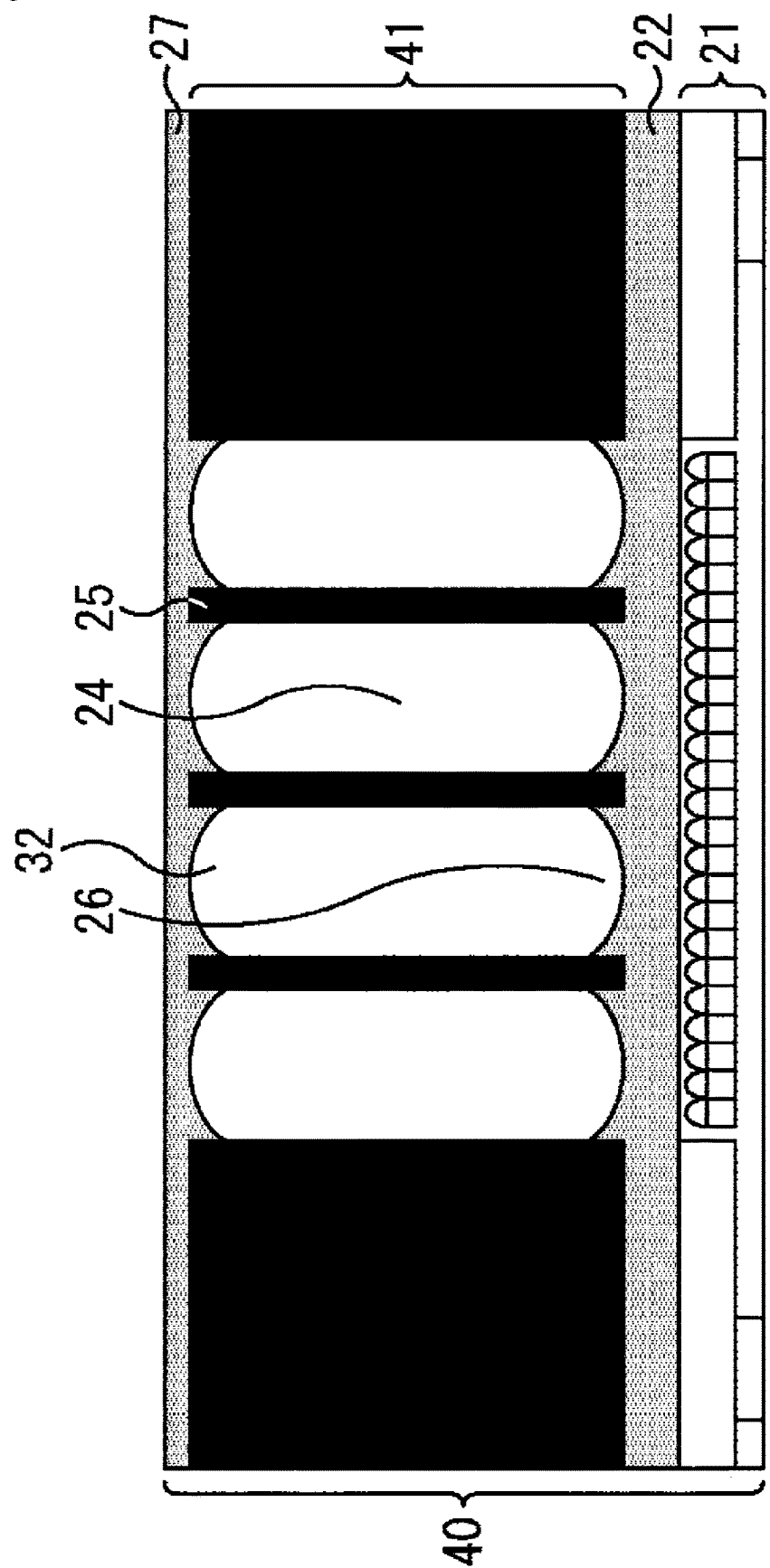

[Fig. 5]
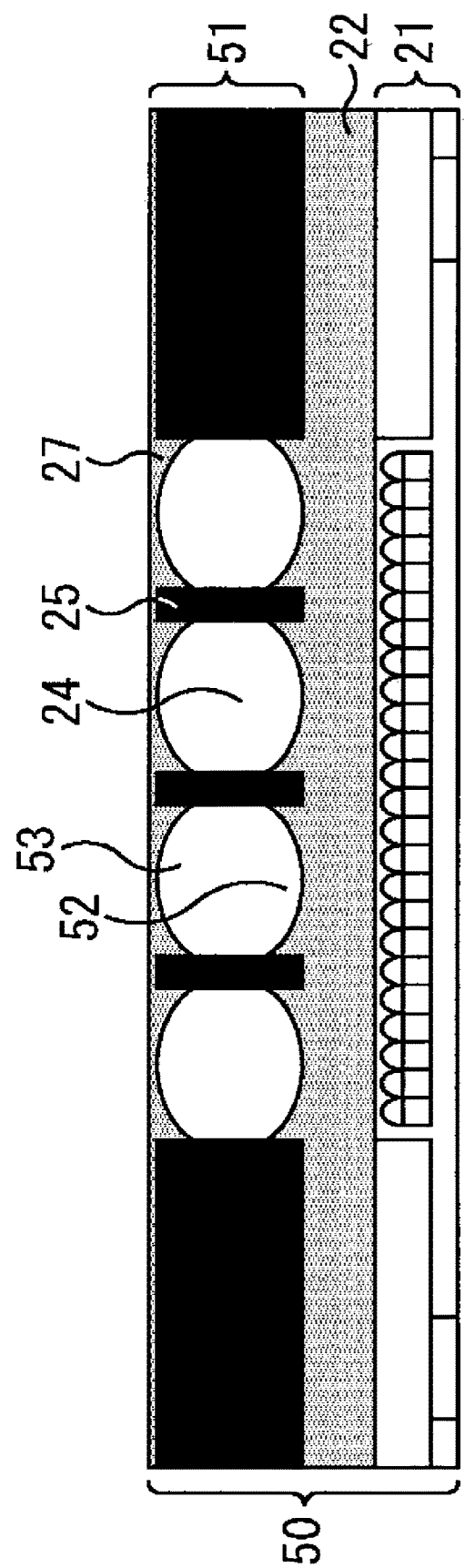

[Fig. 6]
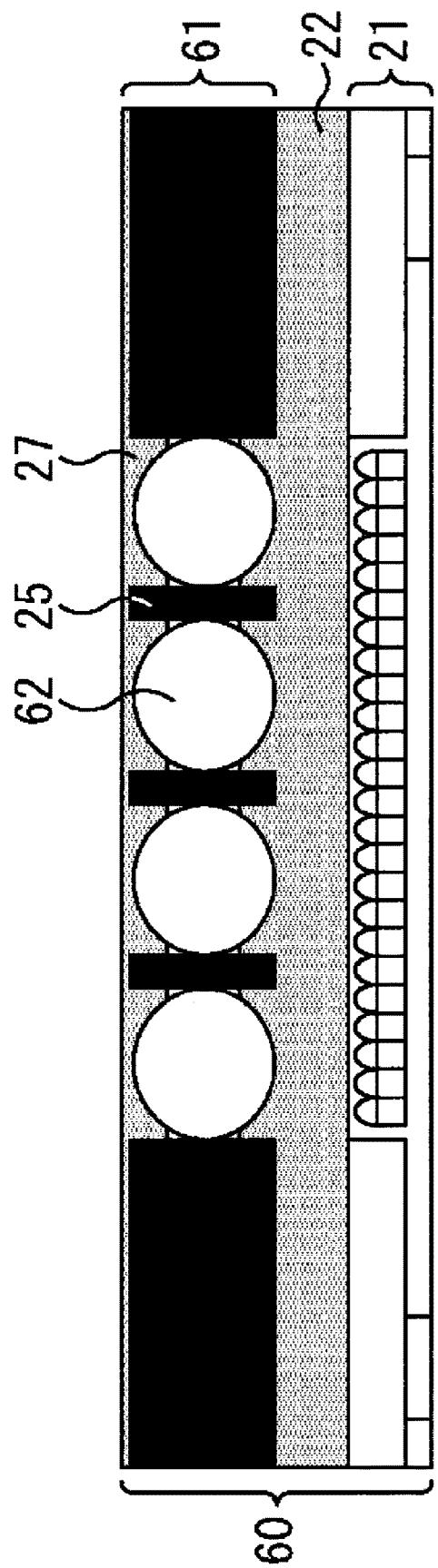

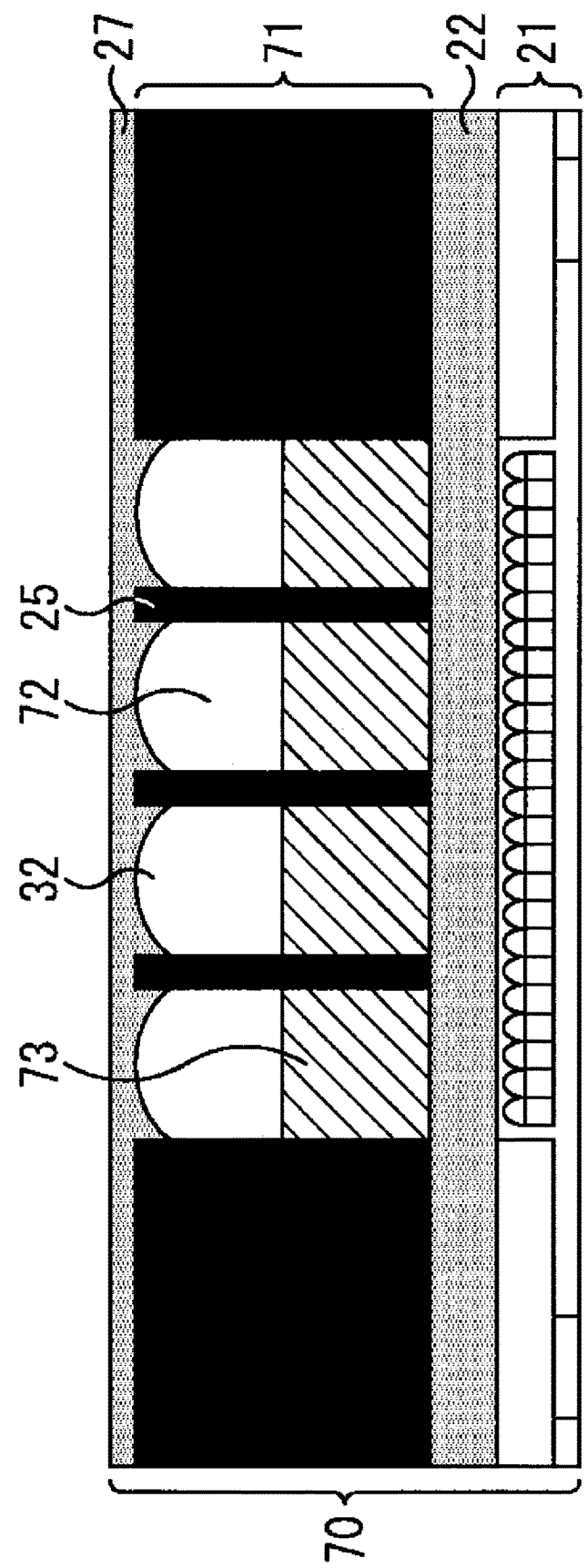
[Fig. 7]

[Fig. 8]
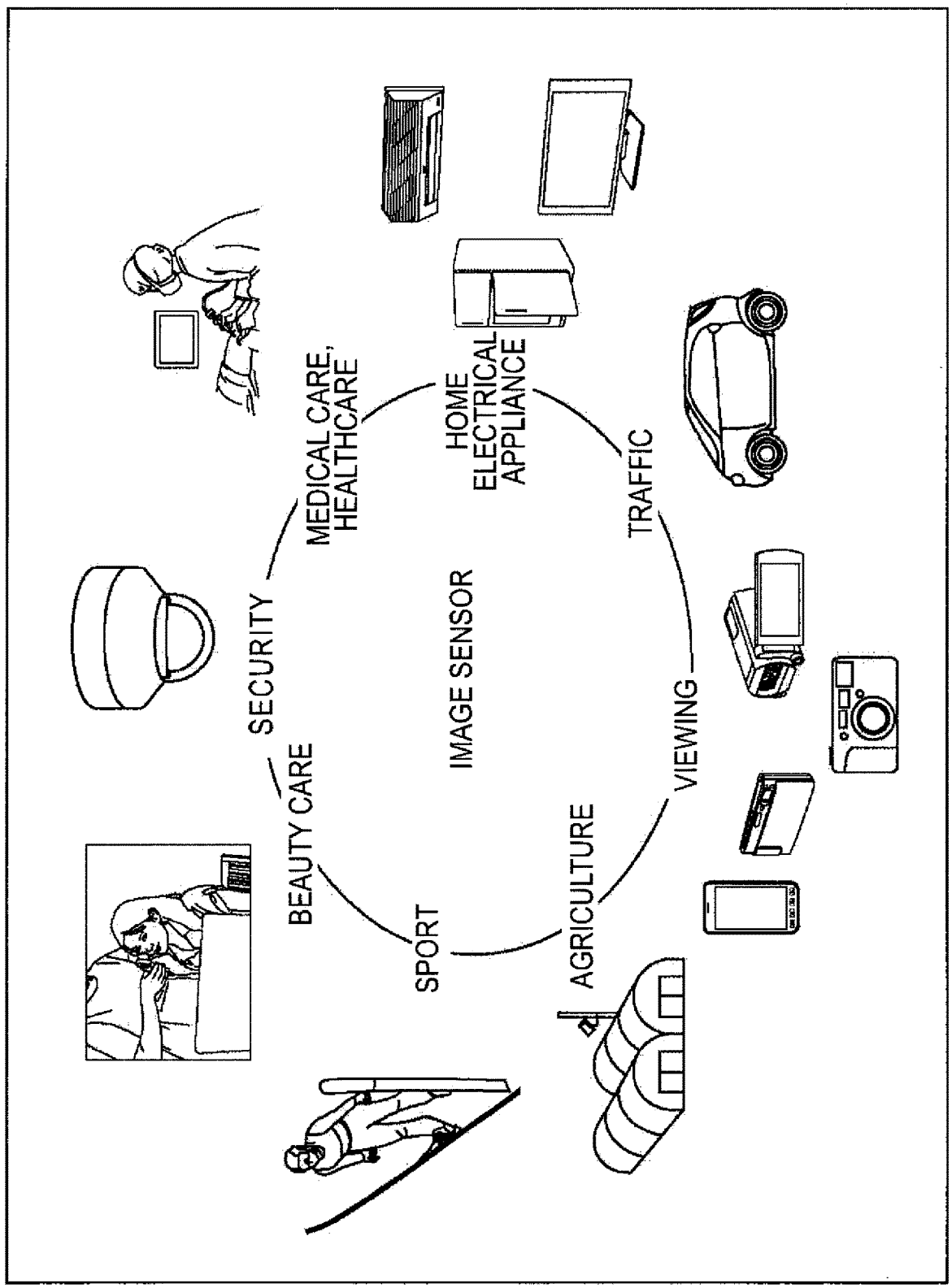

[Fig. 9]
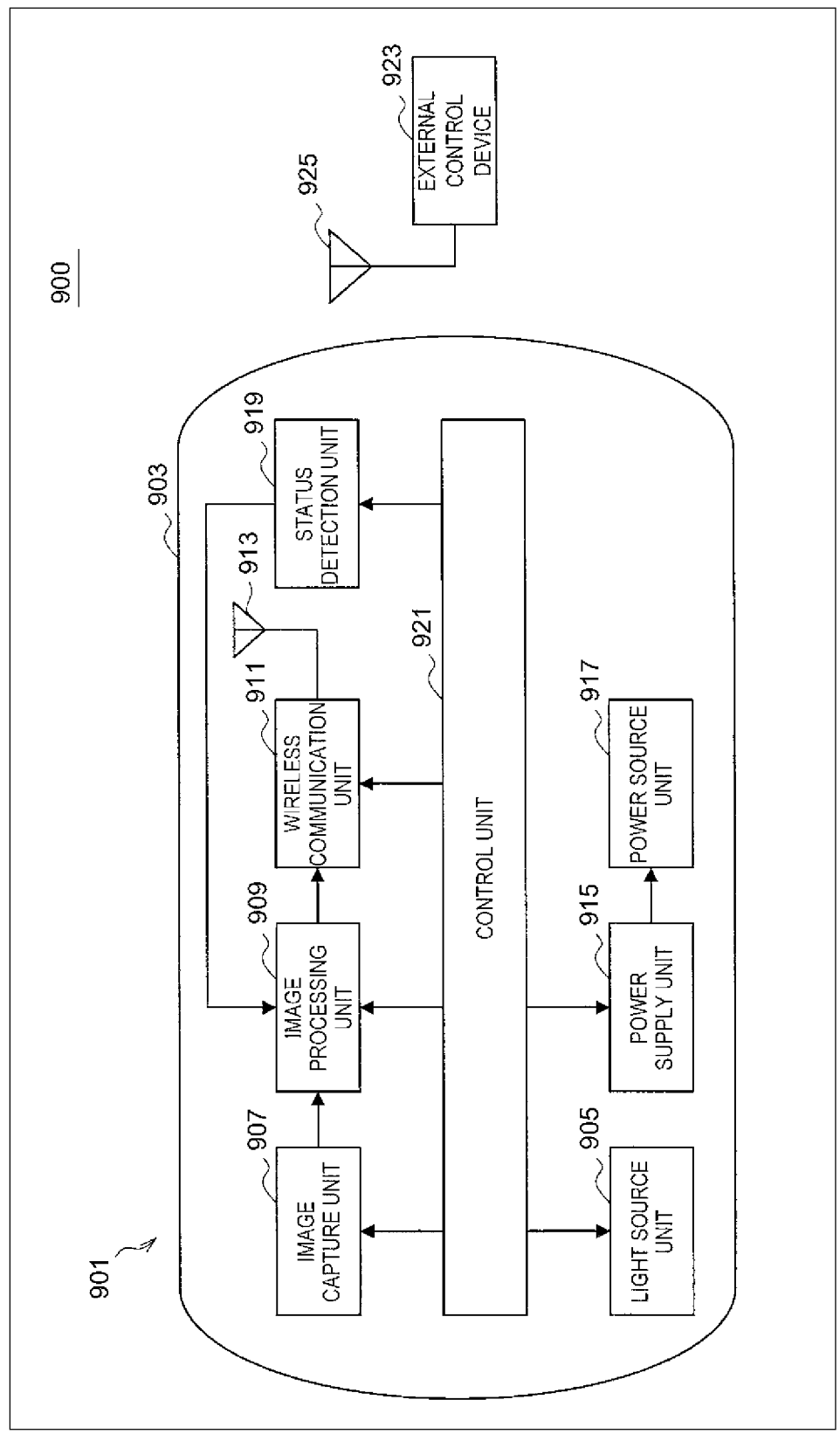

IMAGE SENSOR AND ELECTRONIC APPARATUS

CROSS REFERENCE TO RELATED APPLICATIONS

This application is a national stage application under 35 U.S.C. 371 and claims the benefit of PCT Application No. PCT/JP2016/003048 having an international filing date of 24 Jun. 2016, which designated the United States, which PCT application claimed the benefit of Japanese Priority Patent Application JP 2015-136840 filed Jul. 8, 2015, the entire contents of each of which are incorporated herein by reference in their entirety.

TECHNICAL FIELD

The present disclosure relates to image sensors and electronic apparatus, and more particularly to an image sensor and electronic apparatus suitable to be used in the compound eye optical system as an example.

BACKGROUND ART

In the prior art, a known example of the image sensor used in the compound eye optical system is the configuration including a light blocking member provided between a microlens and a photodetector (e.g., refer to PTL 1).

FIG. 1 illustrates an exemplary configuration of aspects of an image sensor in the prior art, which includes a light blocking member provided between a microlens and a photodetector.

The image sensor 10 is configured to include a photodetector layer 11, a transparent insulating layer 13, a light blocking member 14, and a microlens array 17 that are stacked on top of one another. The photodetector layer 11 includes a number of photodetectors 12 arranged in a matrix. The light blocking member 14 includes a light blocking wall 15 made of a black pigment resin and a light transmitting portion 16 made of a photopolymerizable resin. The microlens array 17 has a cover glass stacked on the top of a microlens to be planarized.

CITATION LIST

Patent Literature

PTL 1: JP 2005-072662A

SUMMARY OF INVENTION

Technical Problem

In the image sensor 10 described above, it is necessary to form the microlens 17 on (e.g., above) the light blocking member 14, and it is also necessary to planarize the microlens 17 by stacking a cover glass or the like on the top thereof. Each of these increase the overall height of the image sensor 10, thereby making it difficult to achieve a low profile.

The present disclosure is made in view of such circumstances. These and other issues are addressed by the various embodiments and configurations of the present disclosure. For example, embodiments of the present disclosure achieve an improved lower-profile image sensor having, for example, a structure in which a light blocking member is placed on a photodetector layer.

Solution to Problem

Various embodiments of the present disclosure relate to imaging devices, including: a photodetector layer; and a light-blocking member stacked above the photodetector layer, where the light-blocking member includes at least one light-transmitting portion and at least one lens portion.

Various embodiments may include an imaging device further including: a transparent layer positioned between the photodetector layer and the light-blocking member, and the transparent layer may include a resin and may be positioned such that there is no gap between the photodetector layer and the light-blocking member.

Various embodiments may include an imaging device where the light-blocking member includes a plurality of light-transmitting portions and a plurality of light-blocking walls, and where the light-blocking walls are positioned between each of the light transmitting portions, and each of the plurality of light-blocking walls may be silicon. Various embodiments may include an imaging device where the at least one lens portion is formed within the at least one light-transmitting portion, and where the at least one light-transmitting portion may be a transparent material and the at least one lens portion may be the transparent material.

Various embodiments may include an imaging device where the at least one lens portion has a convex shape towards the photodetector layer, and where the at least one lens portion is located closer to the photodetector layer than a light-receiving side of the at least one light-transmitting portion.

Various embodiments may include an imaging device where the at least one light-transmitting portion has a refractive index of about 1.4, and various embodiments may include an imaging device where a refractive index of the transparent layer is lower than a refractive index of the at least one light-transmitting portion.

Various embodiments may include an imaging device where the at least one lens portion has a concave shape towards a light-receiving side of the at least one light-transmitting portion, and where the at least one lens portion is located closer to a light-receiving side of the at least one light-transmitting portion than the photodetector layer.

Various embodiments may include an imaging device where the at least one lens portion includes an upper lens portion having a convex shape and a lower lens portion having a concave shape. Various embodiments may include an imaging device further including a protective film on a light-receiving side of the light-blocking member, where the transparent layer and the protective film each have a refractive index lower than a refractive index of the at least one light-transmitting portion.

Various embodiments may include an imaging device where the at least one lens portion has an approximately spherical shape.

Various embodiments may include an imaging device where the light-blocking member further includes a first layer and a second layer, and where the second layer is an α-ray blocking layer. Various embodiments may include an imaging device where the first layer includes a heavy metal, and where the second layer includes SiO.

Various embodiments may include an imaging device where the first layer includes a heavy metal, and where the second layer includes SiO. where the at least one lens portion is a border between the first layer and the second layer.

According to further various embodiments of the present disclosure, there is provided methods of manufacturing an imaging device, the methods including: forming a photodetector layer; and forming a light-blocking member stacked above the photodetector layer, where the light-blocking member includes at least one light-transmitting portion and at least one lens portion.

According to further various embodiments of the present disclosure, there is provided electronic apparatuses, including: an imaging device, including: a photodetector layer; and a light-blocking stacked above the photodetector layer, where the light-blocking member includes at least one light-transmitting portion and at least one lens portion. In various embodiments, the lens portion may include a first lens portions, or both a first and a second lens portion. The first and second lens portions may be referred to using alternative language, for example, an upper and/or lower lens portion.

Advantageous Effects of Invention

According to the embodiments of the present disclosure, a low-profile image sensor can be achieved. The present disclosure can provide a number of advantages depending on the particular configuration. These and other advantages will be apparent from the disclosure contained herein.

BRIEF DESCRIPTION OF DRAWINGS

FIG. 1 is a sectional view illustrating an exemplary configuration of aspects of an image sensor in the prior art.

FIG. 2 is an illustrative sectional view showing a first configuration example of an image sensor to which embodiments of the present disclosure are applied.

FIG. 3 is an illustrative sectional view showing a second configuration example of an image sensor to which embodiments of the present disclosure are applied.

FIG. 4 is an illustrative sectional view showing a third configuration example of an image sensor to which embodiments of the present disclosure are applied.

FIG. 5 is an illustrative sectional view showing a fourth configuration example of an image sensor to which embodiments of the present disclosure are applied.

FIG. 6 is an illustrative sectional view showing a fifth configuration example of an image sensor to which embodiments of the present disclosure are applied.

FIG. 7 is an illustrative sectional view showing a sixth configuration example of an image sensor to which embodiments of the present disclosure are applied.

FIG. 8 is an illustrative view showing usage examples of an electronic apparatus to which embodiments of the present disclosure are applied.

FIG. 9 is an illustrative diagram showing an example of a schematic configuration of an internal information acquisition system to which embodiments of the present disclosure are applied.

DESCRIPTION OF EMBODIMENTS

The following is a detailed description of illustrative embodiments of the present disclosure, including references to the drawings.

<First Configuration Example of an Illustrative Image Sensor According to Embodiments of the Present Disclosure>

FIG. 2 illustrates a first configuration example of an image sensor according to illustrative embodiments of the present disclosure.

The image sensor 20 is formed, for example, to include a separately manufactured photodetector layer 21 and a light blocking member 23 which are joined by a resin layer 22.

The photodetector layer 21 includes a number of photodetectors arranged in a matrix. The resin layer 22 is made of a transparent material, and is arranged to join the photodetector layer 21 and the light blocking member 23 together without a gap between them, or with a reduced gap between them.

In various embodiments disclosed herein, the light blocking member may include one or more portions that are light-blocking and one or more portions that are light-transmitting, and portions of the light blocking member may include one or more light blocking walls. The term light blocking may also be referred to as light-blocking herein, the term light transmitting may also be referred to as light-transmitting, and the term. Also, the light blocking member may have a height or a maximum height that is the same as a height of any light-transmitting portions. For example, any light-transmitting portions may be contained within the light blocking member, or within a height or a maximum height of the light blocking member. In FIG. 2, the light blocking member 23 includes a light blocking wall 25 (or multiple light blocking walls) made of a light blocking material such as Si, a light transmitting portion 24 (or multiple light transmitting portions) made of a transparent material such as glass or resin, and a lower lens portion 26 formed on the lower side (e.g., at the side of the photodetector, further from a light receiving surface of the light transmitting portion 24) of the light transmitting portion 24. In various embodiments of the present disclosure, a lower lens portion may be formed within the light transmitting portion. The lower lens portion may be formed within the light transmitting portion that is within the light blocking member. The lower lens portion may be formed integrally (e.g., as one unit) with the light transmitting portion, and may be located in any position within the light transmitting portion. Also, for example, in FIG. 1, the light blocking wall 25 is formed as a through hole defined by processing the light blocking material such as Si using lithography, dry etching, and other techniques. In various embodiments of the present disclosure, there may be multiple light transmitting portions, each having one or more lens portions, and each of the light transmitting portions being separated from the other by a light blocking wall. In FIG. 1, for example, the light transmitting portion 24 is formed with a transparent material filled between the light blocking walls 25 (i.e., through holes). The lower lens portion 26 is formed by processing the transparent material of the light transmitting portion 24 into a lens shape. The lens shape may be any shape or size, and is not limited to the shapes and sizes shown illustratively in the figures described herein. The lower lens portions 26, which are each formed between the light blocking walls 25, can focus the incident light onto the photodetector layer 21 immediately below it.

A protective film 27 may be arranged for the purpose of protection and planarization of the light incident surface of the light blocking member 23.

In FIG. 2, for example, the lower lens portion 26 in the light transmitting portion 24 has a convex shape in the downward direction (e.g., having a curvature that protrudes toward the side of the photodetector layer 21). When the light transmitting portion 24 is made of a transparent material of glass, its refractive index is, for example, about 1.4. The resin layer 22 may have a refractive index lower than that of the light transmitting portion 24. The resin layer 22 having a refractive index lower than that of the light transmitting portion 24 may advantageously improve the performance of the imaging devices and imaging methods disclosed herein.

The shape of the lower lens portion 26 is, for example, determined depending on the type of an image that is intended to be outputted from the image sensor 20 (or an image that is output from the image sensor 20), and the shape is not limited to the illustrated convex shape, but may be a concave shape, for example, as long as a desired image can be formed on the photodetector.

In the image sensor 20, the lower lens portion 26 focuses the light, which is incident on the light transmitting portion 24 of the light blocking member 23, onto a section of the photodetector layer 21 immediately below it. Thus, the microlens array 17 including the microlens and the planarization film as illustrated in FIG. 1 is unnecessary, thereby advantageously lowering the height of the image sensor 20.

The photodetector layer 21 and the light blocking member 23 are joined together without a gap by the resin layer 22. This may advantageously reduce or prevent the occurrence of dew condensation that is likely to generate in the gap in the prior art. Accordingly, it is possible to eliminate or reduce the deterioration of an obtained image.

<Second Configuration Example of an Illustrative Image Sensor according to Embodiments of the Present Disclosure>

FIG. 3 illustrates a second configuration example of an image sensor according to illustrative embodiments of the present disclosure.

The components of an image sensor 30 according to the second configuration example that are similar to those of the image sensor 20 described above are denoted with the same reference numerals, and description thereof is omitted as appropriate.

The image sensor 30, for example, is formed to include a separately manufactured photodetector layer 21 and a light blocking member 31 which are joined by a resin layer 22.

The light blocking member 31 includes a light blocking wall 25 made of a light blocking material such as Si, a light transmitting portion 24 made of a transparent material such as glass or resin, and an upper lens portion 32 formed on the upper side (at the incident side of light) of the light transmitting portion 24. The light blocking wall 25 is formed as a through hole defined by processing the light blocking material such as Si using lithography, dry etching, and other techniques. The light transmitting portion 24 is formed with a transparent material filled between the light blocking walls 25 (i.e., through holes). The upper lens portion 32 is formed by processing the transparent material of the light transmitting portion 24 into a lens shape. The upper lens portions 32, which are each formed between the light blocking walls 25, can focus the incident light onto the photodetector layer 21 immediately below it. In various embodiments of the present disclosure, an upper lens portion may be formed within the light transmitting portion, or within a height of the light blocking member or a height of the light transmitting portion. The upper lens portion may be formed within the light transmitting portion that is within the light blocking member. The upper lens portion may be formed integrally (e.g., as one unit) with the light transmitting portion, and may be located in any position within the light transmitting portion.

In FIG. 3, the upper lens portion 32 has a convex shape in the upward direction (e.g., where the curvature of the convex shape extends at its apex toward the side of the light incident surface). When the light transmitting portion 24 is made of a transparent material of glass, its refractive index is, for example, about 1.4. The refractive index of a protective film 27 may be less than that of the light transmitting portion 24. The refractive index of the resin layer 22 joined to the light transmitting portion 24 may be as close as possible to that of the light transmitting portion 24. The refractive index of a protective film 27 being less than that of the light transmitting portion 24, and/or the refractive index of the resin layer 22 joined to the light transmitting portion 24 being as close as possible to that of the light transmitting portion 24, may advantageously improve the performance of the imaging devices and imaging methods disclosed herein.

The shape of the upper lens portion 32 is determined depending on the type of an image that is intended to be outputted from the image sensor 30 (or that is output from the image sensor 30), and the shape is not limited to the illustrated convex shape, but may be a concave shape, for example, as long as a desired image can be formed on the photodetector.

In the image sensor 30, the incident light that is focused by the upper lens portion 32 of the light blocking member 31 passes through the light transmitting portion 24 and is focused onto a section of the photodetector layer 21 immediately below it. Thus, in various embodiments, the microlens array 17 including the microlens and the planarization film as illustrated in FIG. 1 is unnecessary, thereby advantageously lowering the height of the image sensor 30.

The photodetector layer 21 and the light blocking member 31 are joined together without a gap, or with a reduced gap, by the resin layer 22. This may advantageously reduce or prevent the occurrence of dew condensation that is likely to generate in the gap in the prior art. Accordingly, it is advantageously possible to eliminate or reduce the deterioration of an obtained image.

<Third Configuration Example of an Illustrative Image Sensor According to Embodiments of the Present Disclosure>

FIG. 4 illustrates a third configuration example of an image sensor according to illustrative embodiments of the present disclosure.

The components of an image sensor 40 according to the third configuration example that are similar to those of the image sensor 20 or 30 described above are denoted with the same reference numerals, and description thereof is omitted as appropriate.

The image sensor 40, for example, is formed to include a separately manufactured photodetector layer 21 and a light blocking member 41 which are joined by a resin layer 22.

The light blocking member 41 includes a light blocking wall 25, a light transmitting portion 24, a lower lens portion 26, and an upper lens portion 32. The light blocking wall 25 is made of a light blocking material such as Si, and the light transmitting portion 24 is made of a transparent material such as glass or resin. The lower lens portion 26 is formed on the lower side (at the side of the photodetector) of the light transmitting portion 24, and the upper lens portion 32 is formed on the upper side (e.g., at the incident side of light, closer to a light receiving surface of the light transmitting portion 24) of the light transmitting portion 24. In various embodiments of the present disclosure, multiple lens portions may be formed within a light transmitting portion. For example, both an upper lens portion and a lower lens portion may be formed within the light transmitting portion, or within a height of the light blocking member or a height of the light transmitting portion. All of the multiple lens portions may be formed within the light transmitting portion that is within the light blocking member. Multiple lens portions may be formed within the light transmitting portion such that they overlap in a depth direction (e.g., such that light is transmitted through each of the multiple lens portions before reaching a photodetector layer). The multiple lens portions may each be formed integrally (e.g., as one unit) with the light transmitting portion, and may be located in any position within the light transmitting portion.

In FIG. 4, for example, the lower lens portion 26 has a convex shape in the downward direction (e.g., with the apex of the convex shape extending towards the side of the photodetector within the light transmitting portion 24), and the upper lens portion 32 has a convex shape in the upward direction (e.g., with the apex of the convex shape extending towards the side of the light incident surface of the light transmitting portion 24 within the light transmitting portion 24). When the light transmitting portion 24 is made of a transparent material of glass, its refractive index is, for example, about 1.4. The resin layer 22 and a protective film 27 each may have a refractive index lower than that of the light transmitting portion 24. The resin layer 22 and/or a protective film 27 having a refractive index lower than that of the light transmitting portion 24 may advantageously improve the performance of the imaging devices and imaging methods disclosed herein.

In the image sensor 40, the incident light that is focused by the upper lens portion 32 and the lower lens portion 26 of the light blocking member 41 is focused onto a section of the photodetector layer 21 immediately below them. Thus, the microlens array 17 including the microlens and/or the planarization film as illustrated in FIG. 1 is unnecessary, thereby advantageously lowering the height of the image sensor 40.

The photodetector layer 21 and the light blocking member 41 are joined together without a gap by the resin layer 22 (or with a reduced gap), and thus the occurrence of dew condensation that is likely to generate in the gap in the prior art can be advantageously reduced or prevented. Accordingly, it is possible to eliminate or reduce the deterioration of an obtained image.

<Fourth Configuration Example of an Illustrative Image Sensor According to Embodiments of the Present Disclosure>

FIG. 5 illustrates a fourth configuration example of an image sensor according to illustrative embodiments of the present disclosure.

The components of an image sensor 50 according to the fourth configuration example that are similar to those of the image sensor 20, 30, or 40 described above are denoted with the same reference numerals, and description thereof is omitted as appropriate.

The image sensor 50, for example, is formed to include a separately manufactured photodetector layer 21 and a light blocking member 51 which are joined by a resin layer 22.

The light blocking member 51 includes a light blocking wall 25, a light transmitting portion 24, a lower lens portion 52, and an upper lens portion 53. The light blocking wall 25 is made of a light blocking material such as Si, and the light transmitting portion 24 is made of a transparent material such as glass or resin. The lower lens portion 52 is formed on the lower side (at the side of the photodetector) of the light transmitting portion 24, and the upper lens portion 53 is formed on the upper side (at the incident side of light) of the light transmitting portion 24.

When the light transmitting portion 24 is made of a transparent material of glass, its refractive index is, for example, about 1.4. The resin layer 22 and a protective film 27 each may have a refractive index lower than that of the light transmitting portion 24. The resin layer 22 and/or a protective film 27 each having a refractive index lower than that of the light transmitting portion 24 may advantageously improve the performance of the imaging devices and imaging methods disclosed herein.

In FIG. 5, for example, the lower lens portion 52 has a convex shape in the downward direction (e.g., having an apex that extends toward the side of the photodetector within the light transmitting portion 24), and the upper lens portion 53 has a convex shape in the upward direction (e.g., having an apex that extends toward the side of the light incident surface of the light transmitting portion 24 within the light transmitting portion 24). The lower lens portion 52 and the upper lens portion 53 are each formed in a convex shape having a curvature that is larger than that of the lower lens portion 26 and the upper lens portion 32 of the image sensor 40. For example, as shown in FIG. 5, the combination of the curvatures of the upper lens portion 53 and the lower lens portion 52 may result in a generally spherical shape such as a spherical shape having side portions with straight lines. This advantageously allows the light blocking member 51 to be formed to have a thickness that is thinner than that of the light blocking member 41 of the image sensor 40.

In the image sensor 50, the incident light that is focused by the upper lens portion 53 and the lower lens portion 52 of the light blocking member 51 is focused onto a section of the photodetector layer 21 immediately below them. Thus, the microlens array 17, or a portion of the microlens array 17, including the microlens and/or the planarization film as illustrated in FIG. 1 is unnecessary. As described above, the light blocking member 51 can be formed to advantageously have a reduced thickness, thereby advantageously lowering the height of the image sensor 50.

The photodetector layer 21 and the light blocking member 51 are joined together without a gap by the resin layer 22, and thus the occurrence of dew condensation that is likely to generate in the gap in the prior art can be advantageously reduced or prevented. Accordingly, it is possible to eliminate or reduce the deterioration of an obtained image.

<Fifth Configuration Example of an Illustrative Image Sensor According to Embodiments of the Present Disclosure>

FIG. 6 illustrates a fifth configuration example of an image sensor according to illustrative embodiments of the present disclosure.

The components of an image sensor 60 according to the fifth configuration example that are similar to those of the image sensor 20, 30, 40, or 50 described above are denoted with the same reference numerals, and description thereof is omitted as appropriate.

The image sensor 60 is formed, for example, to include a separately manufactured photodetector layer 21 and a light blocking member 61 which are joined by a resin layer 22.

In FIG. 6, for example, the light blocking member 61 includes a light blocking wall 25 made of a light blocking material such as Si and a spherical lens portion 62 made of a transparent material such as glass or resin. The spherical lens portion 62 may be a generally spherical or round shape. When the spherical lens portion 62 is made of a transparent material of glass, its refractive index is, for example, about 1.4. The resin layer 22 and a protective film 27 may have a refractive index lower than that of the spherical lens portion 62. The resin layer 22 and/or a protective film 27 having a refractive index lower than that of the spherical lens portion 62 may advantageously improve the performance of the imaging devices and imaging methods disclosed herein.

The spherical lens portion 62 is arranged within the light blocking member 61, or has a height that is within a height of the light blocking member 61. This advantageously allows the light blocking member 61 to be formed to have the thickness thinner than that of the light blocking member 51 of the image sensor 50.

In the image sensor 60, the incident light that is focused by the spherical lens portion 62 of the light blocking member 61 is focused onto a section of the photodetector layer 21 immediately below it. Thus, advantageously, the microlens array 17 (or a portion therof) including the microlens and/or the planarization film as illustrated in FIG. 1 is unnecessary. As described above, the light blocking member 61 can also be formed to advantageously have a reduced thickness, thereby advantageously lowering the height of the image sensor 60.

The photodetector layer 21 and the light blocking member 61 are joined together without a gap (or with a reduced gap) by the resin layer 22, and thus the occurrence of dew condensation that is likely to generate in the gap in the prior art can be prevented. Accordingly, it is possible to advantageously eliminate or reduce the deterioration of an obtained image.

<Sixth Configuration Example of an Illustrative Image Sensor According to Embodiments of the Present Disclosure>

FIG. 7 illustrates a sixth configuration example of an image sensor according to illustrative embodiments of the present disclosure.

The components of an image sensor 70 according to the sixth configuration example that are similar to those of the image sensor 20, 30, 40, 50, or 60 described above are denoted with the same reference numerals, and description thereof is omitted as appropriate.

The image sensor 70, for example, is formed to include a separately manufactured photodetector layer 21 and a light blocking member 71 which are joined by a resin layer 22.

The light blocking member 71 includes a light blocking wall 25, a light transmitting portion 72, an α-ray blocking layer 73, and an upper lens portion 32. The light blocking wall 25 is made of a light blocking material such as Si. The light transmitting portion 72 is made of a transparent material such as high refractive index glass that has a refractive index higher than that of ordinary glass. The α-ray blocking layer 73 is made of a blocking material, such as $SiO_2$, which is transparent but is used to block α-ray. The upper lens portion 32 is formed on the upper side (at the incident side of light) of the light transmitting portion 72. Instead of or in addition to the upper lens portion 32, a boundary between the light transmitting portion 72 and the α-ray blocking layer 73 may have a lens shape, or be processed into a lens shape. Alternatively, the light transmitting portion 72 may have a lens shape, or may be processed into a spherical lens shape.

The light blocking wall 25 is formed as a through hole defined by processing the light blocking material such as Si using lithography, dry etching, and other techniques. The light transmitting portion 72 and the α-ray blocking layer 73 are formed with $SiO_2$ or a similar material and high refractive index glass filled between the light blocking walls 25 (i.e., through holes). The upper lens portion 32 is formed by processing the transparent material of the light transmitting portion 72 into a lens shape. The upper lens portions 32, which are each formed between the light blocking walls 25, can focus the incident light onto the photodetector layer 21 immediately below it.

The high refractive index glass forming the upper lens portion 32 and the light transmitting portion 72 contains heavy metals such as uranium and thorium mixed with the glass and thus the amount of α-ray radiation is increased. However, the α-ray blocking layer 73 is arranged to prevent the α-ray radiation emitted from the light transmitting portion 72 from reaching the photodetector layer 21.

When the light blocking member 71 has a thickness of approximately 300 μm, the α-ray blocking layer 73 made of $SiO_2$ is estimated to have a thickness of approximately 20 μm on the assumption that its density is about 2.2 g/cm$^3$. In this case, the thickness of the α-ray blocking layer 73 is approximately ¹⁄₁₅ of that of the light blocking member 71. Thus, the influence on the thermal process caused by the difference in thermal expansion coefficients between the light blocking wall 25 (Si) of the light blocking member 71 and the α-ray blocking layer 73 ($SiO_2$) is reduced, and accordingly, it is considered to exert no influence on the capability of the image sensor 70.

By increasing the thickness of the resin layer 22 instead of providing the α-ray blocking layer 73, it may be possible to advantageously eliminate or reduce the incidence of the α-ray emitted from the light transmitting portion 72 on the photodetector layer 21. However, the increase in the thickness of the resin layer 22 may make it more likely to cause misalignment when the photodetector layer 21 and the light blocking member 71 are joined to each other. In contrast, in the image sensor 70, the arrangement of the α-ray blocking layer 73 allows the thickness of the resin layer 22 to, for example, be reduced to the minimum necessary for the joining between the photodetector layer 21 and the light blocking member 71, thereby advantageously eliminating or reducing the occurrence of misalignment between them.

In FIG. 7, the upper lens portion 32 has a convex shape in the upward direction (e.g., having its apex in the direction of the side of a light incident surface). The upper lens portion 32 can also serve as a wafer level lens (WLL). The upper lens portion 32 and the light transmitting portion 72 are made of, for example, high refractive index glass. Thus, it is possible to advantageously reduce the thickness of the light blocking member 71 such that it is thinner than that of the light blocking member 31 of the image sensor 30 illustrated in FIG. 3, thereby advantageously reducing the overall height to be lower than that of the image sensor 30.

The photodetector layer 21 and the light blocking member 71 are joined together without a gap (or with a reduced gap) by the resin layer 22, and thus the occurrence of dew condensation that is likely to generate in the gap in the prior art can be advantageously reduced or prevented. Accordingly, it is possible to advantageously eliminate or reduce the deterioration of an obtained image.

<Illustrative Usage Examples of Embodiments of the CMOS Image Sensor Disclosed Herein>

FIG. 8 is an illustrative view showing usage examples of the image sensors 20 to 70 described herein.

The image sensors 20 to 70 can be used in various cases of, for example, sensing light such as visible light, infrared light, ultraviolet light, and X-rays, among others. Illustrative use cases are described below.

Illustrative devices include devices that take images used for viewing, such as a digital camera and a portable appliance with a camera function; devices used for traffic, such as an in-vehicle sensor that takes images of areas in front and back of a car, surroundings, and the inside of the car, among other areas, a monitoring camera that monitors travelling vehicles and roads, and a distance sensor that measures distances between vehicles and distances between various objects, which are used for safe driving (e.g., automatic stop), and recognition of the condition of a driver, among other uses; devices used for home electrical appliances, such as a TV, a refrigerator, and an air conditioner, to takes images of a gesture of a user and perform appliance operation in accordance with the gesture; devices used for medical care and health care, such as an endoscope and a device that performs angiography by reception of infrared light; devices used for security, such as a monitoring camera for crime prevention and a camera for personal authentication; devices used for beauty care, such as skin measurement equipment that takes images of the skin and a microscope that takes images of the scalp; devices used for sports, such as an action camera and a wearable camera for sports, among other devices; and devices used for agriculture, such as a camera for monitoring the condition of the field and crops.

The technology according to embodiments of the present disclosure may be applied to various products. For example, the technology according to embodiments of the present disclosure may be applied to an internal information acquisition system for a patient, which uses an endoscopic capsule.

FIG. 9 is an illustrative diagram showing an example of a schematic configuration of an internal information acquisition system 900 to which the technology according to embodiments of the present disclosure may be applied. Referring to FIG. 9, the internal information acquisition system 900 includes an endoscopic capsule 901, and an external control device 923 that centrally controls the operation of the internal information acquisition system 900. The endoscopic capsule 901 is swallowed by a patient in an examination. The endoscopic capsule 901 has an image capture function and a wireless communication function. The endoscopic capsule 901 moves through the interior of organs such as the stomach and the intestines by peristaltic movement or the like, for example, until being excreted naturally from the patient, while also successively capturing images (hereinafter also called internal images) of the interior of the relevant organs at predetermined intervals, and successively wirelessly transmitting information about the internal images to the external control device 923 outside the body. Based on the received information about the internal images, the external control device 923 generates image data for displaying the internal images on a display device (not illustrated). In this way, with the internal information acquisition system 900, images depicting the patient's internal conditions can be obtained continually from the time the endoscopic capsule 901 is swallowed to the time the endoscopic capsule 901 is excreted.

The configurations and functions of the endoscopic capsule 901 and the external control device 923 will be described in further detail. As illustrated in FIG. 9, the endoscopic capsule 901 has the functions of a light source unit 905, an image capture unit 907, an image processing unit 909, a wireless communication unit 911, a power supply unit 915, a power source unit 917, a status detection unit 919, and a control unit 921 built in a capsule-shaped housing 903.

The light source unit 905 includes a light source such as a light-emitting diode (LED), for example, and irradiates the imaging field of the image capture unit 907 with light.

The image capture unit 907 includes an image sensor, such as the image sensors disclosed herein, and an optical system made up of multiple lenses provided in front of the image sensor. Reflected light (hereinafter called observation light) from the light used to irradiate a body tissue which is the object of observation is condensed by the optical system and incident on the image sensor. The image sensor receives and photoelectrically converts the observation light to thereby generate an electrical signal corresponding to the observation light, or in other words, an image signal corresponding to the observed image. The image signal generated by the image capture unit 907 is provided to the image processing unit 909. Advantageous of the image sensors disclosed herein may also be advantageous when used with such an internal information acquisition system 900, For example, the reduced thickness of the image sensors disclosed herein may advantageously reduce the size of the endoscopic capsule 901.

The image processing unit 909 includes a processor such as a central processing unit (CPU) or a graphics processing unit (GPU), and performs various types of signal processing on the image signal generated by the image capture unit 907. This signal processing may be a minimal level of processing (such as image data compression, frame rate conversion, data rate conversion, and/or format conversion, for example) for transmitting the image signal to the external control device 923. Configuring the image processing unit 909 to, for example, perform only a minimal necessary level of processing makes it possible to realize the image processing unit 909 in a more compact form with lower power consumption, which may be advantageous for the endoscopic capsule 901. However, if there is extra space or available power inside the housing 903, additional signal processing (such as a noise removal process or other image quality-improving processes, for example) may also be performed by the image processing unit 909. The image processing unit 909 provides the image signal subjected to the signal processing to the wireless communication unit 911 as raw data. Note that if information about the status (such as movement or orientation) of the endoscopic capsule 901 is acquired by the status detection unit 919, the image processing unit 909 may also provide the image signal to the wireless communication unit 911 in association with the information. This makes it possible to associate the position inside the body where an image is captured, the direction in which the image is captured, and other information with the captured image.

The wireless communication unit 911 includes a communication device capable of transmitting and receiving various types of information to and from the external control device 923. This communication device includes, for example, an antenna 913 and a processing circuit that performs processing such as modulation processing for transmitting and receiving signals. The wireless communication unit 911 performs predetermined processing such as modulation processing on the image signal that was subjected to the signal processing by the image processing unit 909, and transmits the image signal to the external control device 923 via the antenna 913. In addition, the wireless communication unit 911 receives, from the external control device 923 via the antenna 913, a control signal related to driving control of the endoscopic capsule 901. The wireless communication unit 911 provides the received control signal to the control unit 921.

The power supply unit 915 includes, for example, an antenna coil for receiving power, a power regeneration circuit for regenerating power from a current produced in the antenna coil, and a voltage step-up circuit. In the power supply unit 915, the principle of what is called contactless or wireless charging is used to generate power. For example, an external magnetic field (electromagnetic wave) of a predetermined frequency provided to the antenna coil of the power supply unit 915 produces an induced electromotive force in the antenna coil. This electromagnetic wave may be a carrier wave transmitted from the external control device 923 via an antenna 925, for example. Power is regenerated from the induced electromotive force by the power regeneration circuit, and the electric potential of the power is suitably adjusted in the voltage step-up circuit, thereby generating power for power storage. The power generated by the power supply unit 915 is stored in the power source unit 917.

The power source unit 917 includes a secondary battery, and stores power generated by the power supply unit 915. FIG. 9 omits arrows or the like indicating the recipients of power from the power source unit 917 for brevity, but power stored in the power source unit 917 is supplied to the light source unit 905, the image capture unit 907, the image processing unit 909, the wireless communication unit 911, the status detection unit 915, and the control unit 921, and may be used to drive these components.

The status detection unit 919 includes a sensor such as an acceleration sensor and/or a gyro sensor for detecting the status of the endoscopic capsule 901. The status detection unit 919 can acquire information about the status of the endoscopic capsule 901 from detection results from the sensor. The status detection unit 919 provides the acquired information about the status of the endoscopic capsule 901 to the image processing unit 909. As discussed earlier, in the image processing unit 909, the information about the status of the endoscopic capsule 901 may be associated with the image signal.

The control unit 921 includes a processor such as a central processing unit (CPU), and centrally controls the operation of the endoscopic capsule 901 by operating in accordance with a predetermined program. The control unit 921 appropriately controls the driving of the light source unit 905, the image capture unit 907, the image processing unit 909, the wireless communication unit 911, the power supply unit 915, the power source unit 917, and the status detection unit 919 in accordance with a control signal transmitted from the external control device 923, thereby realizing the function of each component as described above.

The external control device 923 may be a processor such as a CPU or GPU, or a device such as a microcontroller or a control board on which a processor and a storage element such as memory are mounted. The external control device 923 includes the antenna 925, and is capable of transmitting and receiving various types of information to and from the endoscopic capsule 901 via the antenna 925. For example, the external control device 923 controls the operation of the endoscopic capsule 901 by transmitting a control signal to the control unit 921 of the endoscopic capsule 901. For example, a light irradiation condition under which the light source unit 905 irradiates a target of observation with light may be changed by a control signal from the external control device 923. In addition, an image capture condition (such as the frame rate and the exposure level in the image capture unit 907, for example) may be changed by a control signal from the external control device 923. In addition, the content of processing in the image processing unit 909 and a condition (such as the transmission interval and the number of images to transmit, for example) under which the wireless communication unit 911 transmits the image signal may be changed by a control signal from the external control device 923.

In addition, the external control device 923 performs various types of image processing on the image signal transmitted from the endoscopic capsule 901, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 923 controls the driving of a display device (not illustrated), and causes the display device to display a captured internal image on the basis of the generated image data. Alternatively, the external control device 923 may also cause a recording device (not illustrated) to record the generated image data, or cause a printing device (not illustrated) to make a printout of the generated image data.

The above describes an example of the internal information acquisition system 900 to which the technology according to embodiments of the present disclosure may be applied.

In addition, embodiments of the present disclosure are not limited to the above-described embodiments, and various alterations may occur insofar as they are within the scope of the present disclosure.

The embodiments of the present technology are not limited to the above-described embodiments, but various changes can be made without departing from the gist of the present technology. For example, forms in which entire or parts of the above-described plural embodiments are combined can be applied.

The effects described in the present specification are simply illustrative, and are not intended to limit the present technology. There may be effects other than those described herein.

In addition, the present technology can take the following configurations.

(1) An imaging device, including: a photodetector layer; and a light-blocking member stacked above the photodetector layer, where the light-blocking member includes at least one light-transmitting portion and at least one lens portion.

(2) The imaging device according to (1), further including: a transparent layer positioned between the photodetector layer and the light-blocking member.

(3) The imaging device according to any of (1) to (2), where the transparent layer includes a resin.

(4) The imaging device according to any of (1) to (3), where the transparent layer is positioned such that there is no gap between the photodetector layer and the light-blocking member.

(5) The imaging device according to any of (1) to (4), where the light-blocking member includes a plurality of light-transmitting portions and a plurality of light-blocking walls, and where the light-blocking walls are positioned between each of the light transmitting portions.

(6) The imaging device according to any of (1) to (5), where each of the plurality of light-blocking walls is silicon.

(7) The imaging device according to any of (1) to (6), where the at least one lens portion is formed within the at least one light-transmitting portion.

(8) The imaging device according to any of (1) to (7), where the at least one light-transmitting portion is a transparent material and the at least one lens portion is the transparent material.

(9) The imaging device according to any of (1) to (8), where the at least one lens portion has a convex shape towards the photodetector layer, and where the at least one lens portion is located closer to the photodetector layer than a light-receiving side of the at least one light-transmitting portion.

(10) The imaging device according to any of (1) to (9), where the at least one light-transmitting portion has a refractive index of about 1.4.

(11) The imaging device according to any of (1) to (10), where a refractive index of the transparent layer is lower than a refractive index of the at least one light-transmitting portion.

(12) The imaging device according to any of (1) to (11), where the at least one lens portion has a concave shape towards a light-receiving side of the at least one light-transmitting portion, and where the at least one lens portion is located closer to a light-receiving side of the at least one light-transmitting portion than the photodetector layer.

(13) The imaging device according to any of (1) to (12), where the at least one lens portion includes an upper lens portion having a convex shape and a lower lens portion having a concave shape.

(14) The imaging device according to any of (1) to (13), further including a protective film on a light-receiving side of the light-blocking member, where the transparent layer and the protective film each have a refractive index lower than a refractive index of the at least one light-transmitting portion.

(15) The imaging device according to any of (1) to (14), where the at least one lens portion has an approximately spherical shape.

(16) The imaging device according to any of (1) to (15), where the light-blocking member further includes a first layer and a second layer, and where the second layer is an α-ray blocking layer.

(17) The imaging device according to any of (1) to (16), where the first layer includes a heavy metal, and where the second layer includes SiO.

(18) The imaging device according to any of (1) to (17), where the at least one lens portion is a border between the first layer and the second layer.

(19) A method of manufacturing an imaging device, the method including: forming a photodetector layer; and forming a light-blocking member stacked above the photodetector layer, where the light-blocking member includes at least one light-transmitting portion and at least one lens portion.

(20) An electronic apparatus, including: an imaging device, including: a photodetector layer; and a light-blocking stacked above the photodetector layer, where the light-blocking member includes at least one light-transmitting portion and at least one lens portion.

(1)
An image sensor including:
a light blocking member configured to include a light blocking wall and a light transmitting portion filled between the light blocking walls; and
a photodetector layer configured to include a plurality of photodetectors arranged in the photodetector layer, the photodetector being configured to perform photoelectric conversion depending on incident light entering through the light transmitting portion of the light blocking member,
wherein the light transmitting portion included in the light blocking member has at least a part being formed in a lens shape.

(2)
The image sensor according to (1), further including:
a joining layer configured to join the light blocking member and the photodetector layer to each other.

(3)
The image sensor according to (1) or (2), further including:
a protective film configured to planarize an incident side of the light blocking member.

(4)
The image sensor according to any of (1) to (3), wherein the light transmitting portion included in the light blocking member is formed in a lens shape at a side of the photodetector.

(5)
The image sensor according to any of (1) to (3), wherein the light transmitting portion included in the light blocking member is formed in a lens shape at an incident side of light.

(6)
The image sensor according to any of (1) to (3), wherein the light transmitting portion included in the light blocking member is formed in a lens shape at each of a side of the photodetector and an incident side of light.

(7)
The image sensor according to any of (1) to (3), wherein the light transmitting portion included in the light blocking member is formed in a spherical lens shape.

(8)
The image sensor according to any of (1) to (7), wherein the light transmitting portion included in the light blocking member has a first layer made of a high refractive index transparent material and a second layer made of a blocking material used to block an α-ray emitted from the high refractive index transparent material, the first and second layers being stacked on top of one another.

(9)
The image sensor according to (8),
wherein the transparent material included in the first layer contains a heavy metal.

(10)
The image sensor according to (8),
wherein the second layer is made of $SiO_2$.

(11)
An electronic apparatus including:
an image sensor configured to be installed in the electronic apparatus,
wherein the image sensor includes
a light blocking member configured to include a light blocking wall and a light transmitting portion filled between the light blocking walls, and
a photodetector layer configured to include a plurality of photodetectors arranged in the photodetector layer, the photodetector being configured to perform photoelectric conversion depending on incident light entering through the light transmitting portion of the light blocking member, and
wherein the light transmitting portion included in the light blocking member has at least a part being formed in a lens shape.

REFERENCE SIGNS LIST 20 image sensor
21 photodetector layer
22 resin layer
23 light blocking member
24 light transmitting portion
25 light blocking wall
26 lower lens portion
27 protective film
30 image sensor
31 light blocking member 32 upper lens portion
40 image sensor
41 light blocking member
50 image sensor
51 light blocking member
52 lower lens portion
53 upper lens portion
60 image sensor
61 light blocking member
62 spherical lens portion
70 image sensor
71 light blocking member
72 light transmitting portion
73 α-ray blocking layer
900 internal information acquisition system
901 endoscopic capsule
903 housing
905 light source unit
907 image capture unit
909 image processing unit
911 wireless communication unit
913 antenna
915 power supply unit
917 power source unit
919 status detection unit
921 control unit
923 external control device
925 antenna

What is claimed is:

1. An imaging device, comprising:
a photodetector layer;
a light-blocking member stacked above the photodetector layer; and
a transparent layer positioned between the photodetector layer and the light-blocking member, wherein the transparent layer comprises a resin,
wherein the light-blocking member comprises at least one light-transmitting portion and at least one lens portion, wherein the photodetector layer comprises multiple photodetectors directly below each lens portion in a depth direction, and wherein the light-blocking member comprises an α-ray blocking layer.

2. The imaging device according to claim 1, wherein the transparent layer is positioned such that there is no gap between the photodetector layer and the light-blocking member.

3. The imaging device according to claim 1, wherein the light-blocking member comprises a plurality of light-transmitting portions and a plurality of light-blocking walls, and wherein the light-blocking walls are positioned between each of the light transmitting portions, wherein each of the plurality of light-blocking walls is silicon.

4. The imaging device according to claim 1, wherein light incident to the at least one lens portion of the light-blocking member is focused directly onto the multiple photodetectors that are directly below the each lens portion.

5. The imaging device according to claim 1, wherein the at least one lens portion is formed within the at least one light-transmitting portion.

6. The imaging device according to claim 1, wherein the at least one light-transmitting portion is a transparent material and the at least one lens portion is the transparent material.

7. The imaging device according to claim 1, wherein the at least one lens portion has a convex shape towards the photodetector layer, and wherein the at least one lens portion is located closer to the photodetector layer than a light-receiving side of the at least one light-transmitting portion.

8. The imaging device according to claim 1, wherein the at least one light-transmitting portion has a refractive index of about 1.4.

9. The imaging device according to claim 1, wherein a refractive index of the transparent layer is lower than a refractive index of the at least one light-transmitting portion.

10. The imaging device according to claim 1, wherein the at least one lens portion has a concave shape towards a light-receiving side of the at least one light-transmitting portion, and wherein the at least one lens portion is located closer to a light-receiving side of the at least one light-transmitting portion than the photodetector layer.

11. The imaging device according to claim 1, wherein the at least one lens portion comprises an upper lens portion having a convex shape and a lower lens portion having a concave shape.

12. The imaging device according to claim 1, further comprising a protective film on a light-receiving side of the light-blocking member, wherein the transparent layer and the protective film each have a refractive index lower than a refractive index of the at least one light-transmitting portion.

13. The imaging device according to claim 1, wherein the at least one lens portion has an approximately spherical shape.

14. The imaging device according to claim 1, wherein the light-blocking member further comprises a first layer and a second layer, wherein the second layer is the α-ray blocking layer, and wherein the first layer comprises a heavy metal, and wherein the second layer comprises SiO.

15. The imaging device according to claim 1, wherein light received at a surface of the photodetector layer is focused directly from a position within the light-blocking member.

16. The imaging device according to claim 14, wherein the at least one lens portion is a border between the first layer and the second layer.

17. A method of manufacturing an imaging device, the method comprising:
forming a photodetector layer;
forming a light-blocking member stacked above the photodetector layer; and
forming a transparent layer positioned between the photodetector layer and the light-blocking member, wherein the transparent layer comprises a resin,
wherein the light-blocking member comprises at least one light-transmitting portion and at least one lens portion, wherein the photodetector layer comprises multiple photodetectors directly below each lens portion in a depth direction, and wherein the light-blocking member comprises an α-ray blocking layer.

18. An electronic apparatus, comprising:
an imaging device, comprising:
a photodetector layer;
a light-blocking stacked above the photodetector layer; and
a transparent layer positioned between the photodetector layer and the light-blocking member, wherein the transparent layer comprises a resin, wherein the light-blocking member comprises at least one light-transmitting portion and at least one lens portion, wherein the photodetector layer comprises multiple photodetectors directly below each lens portion in a depth direction, and wherein the light-blocking member comprises an α-ray blocking layer.

19. The imaging device according to claim 1, wherein the transparent layer is in direct contact with each of the photodetector layer and the light-blocking member.

* * * * *